United States Patent [19]

Shore

[11] Patent Number: 5,953,266
[45] Date of Patent: *Sep. 14, 1999

[54] DEVICE AND METHOD FOR REPAIRING A MEMORY ARRAY BY STORING EACH BIT IN MULTIPLE MEMORY CELLS IN THE ARRAY

[75] Inventor: Michael A. Shore, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/015,542

[22] Filed: Jan. 29, 1998

Related U.S. Application Data

[62] Division of application No. 08/775,510, Dec. 31, 1996, Pat. No. 5,781,483.

[51] Int. Cl.[6] .................................................... G11C 7/00
[52] U.S. Cl. ........................... 365/200; 365/149; 365/201
[58] Field of Search .................................. 365/200, 149, 365/190, 230.03, 230.04, 230.06, 201

[56] References Cited

U.S. PATENT DOCUMENTS

| | | | |
|---|---|---|---|
| 4,459,685 | 7/1984 | Sud et al. | 365/200 |
| 4,601,019 | 7/1986 | Shah et al. | 365/200 |
| 5,144,584 | 9/1992 | Hoshino | 365/222 |
| 5,291,443 | 3/1994 | Lim | 365/189.04 |
| 5,339,273 | 8/1994 | Taguchi | 365/201 |
| 5,373,475 | 12/1994 | Nagase | 365/222 |
| 5,381,368 | 1/1995 | Morgan et al. | 365/189.01 |
| 5,422,850 | 6/1995 | Sukegawa et al. | 365/200 |
| 5,440,517 | 8/1995 | Morgan et al. | 365/202 |
| 5,461,587 | 10/1995 | Oh | 365/200 |
| 5,469,393 | 11/1995 | Thomann | 365/201 |
| 5,471,430 | 11/1995 | Sawada et al. | 365/222 |
| 5,502,675 | 3/1996 | Kohno et al. | 365/200 |
| 5,528,539 | 6/1996 | Ong et al. | 365/200 |
| 5,555,212 | 9/1996 | Toshiaki et al. | 365/200 |
| 5,592,428 | 1/1997 | Harrand et al. | 365/210 |
| 5,689,465 | 11/1997 | Sukegawa et al. | 365/200 |
| 5,689,467 | 11/1997 | Hashimoto | 365/201 |
| 5,754,486 | 5/1998 | Nevill et al. | 365/201 |
| 5,781,483 | 7/1998 | Shore | 365/200 |

Primary Examiner—Son Mai
Attorney, Agent, or Firm—Trask, Britt & Rossa

[57] ABSTRACT

A DRAM array is repairable when the array includes memory cells that are defective because their storage capacitors are unable to retain a sufficient electric charge to properly store "1" and "0" bits. To repair the array, both even and odd row decoders in the array are permanently enabled so that each row address the array receives causes the even row decoder to energize at least one even word line and the odd row decoder to energize at least one odd word line. As a result, at least two memory cells are accessed for each row address so that each "1" or "0" bit is stored as an electric charge in at least two memory cells. By grouping enough memory cells together in this manner to store each "1" and "0" bit, the grouped memory cells are able to retain a sufficient total electric charge as a group to properly store each bit even when individual memory cells in the group are unable to do so.

1 Claim, 6 Drawing Sheets

DEVICE AND METHOD FOR REPAIRING A MEMORY ARRAY BY STORING EACH BIT IN MULTIPLE MEMORY CELLS IN THE ARRAY

This is a divisional of Ser. No. 08/775,510 filed Dec. 31, 1996, now U.S. Pat. No. 5,781,483.

BACKGROUND

1. Field of the Invention

The present invention relates in general to memory array repair, and, in particular, to devices and methods for repairing memory arrays, such as dynamic random access memory arrays, by storing each individual bit in multiple memory cells in the arrays.

2. State of the Art

In general, Dynamic Random Access Memory (DRAM) arrays store digital information in the form of "1" and "0" bits by storing the bits as electric charges on capacitors. DRAM arrays then retrieve the stored bits by discharging their representative electric charges to a conductor, such as a digit line, and then detecting a change in voltage on the conductor resulting from the discharge. When any of the capacitors in a DRAM array are unable to store a sufficient electric charge to cause a detectable change in voltage on a conductor when discharged to the conductor, any "1" or "0" bits stored as electric charges on those capacitors cannot be retrieved by the array. In this circumstance, the array must be repaired by replacing the failing capacitors with redundant capacitors in redundant rows or columns in the array. If too many of the redundant capacitors also fail, then the array must be discarded.

More specifically, a conventional DRAM array 10 shown in FIG. 1 stores digital information in the form of "1" and "0" bits by storing the bits as electric charges on storage capacitors 12, 14, and 16 in memory cells 18, 20, 22 and 24 arranged along word lines (i.e., rows) WL0, WL1, . . . , and WLm and complementary pairs of digit lines (i.e., columns) D0 and D0*, D1 and D1*, . . . , and Dn and Dn*. Of course, while the DRAM array 10 is shown in FIG. 1 as having only nine memory cells in order to simplify description, the array 10 typically includes thousands or millions of memory cells.

The DRAM array 10 stores a "1" bit in the memory cell 18, for example, by energizing the word line WL0 to activate an NMOS transistor 26. The DRAM array then applies a "1" bit voltage equal to a supply voltage $V_{CC}$ (e.g., 3.3 Volts) to the digit line D0, causing current to flow from the digit line D0, through the activated NMOS transistor 26 and the storage capacitor 12, and to a cell plate voltage DVC2 typically equal to one half the supply voltage $V_{CC}$. As this current flows, the storage capacitor 12 stores positive electric charge received from the digit line D0, causing a voltage $V_{S1}$ on the capacitor 12 to increase. When the voltage $V_{S1}$ on the storage capacitor 12 equals the "1" bit voltage on the digit line D0, current stops flowing through the capacitor 12. A short time later, the DRAM array 10 de-energizes the word line WL0 to de-activate the NMOS transistor 26 and isolate the storage capacitor 12 from the digit line D0, thereby preventing the positive electric charge stored on the capacitor 12 from discharging back to the digit line D0.

Similarly, the DRAM array 10 stores a "0" bit in the memory cell 20, for example, by energizing the word line WL1 to activate an NMOS transistor 28. The DRAM array 10 then applies a "0" bit voltage approximately equal to a reference voltage $V_{SS}$ (e.g., 0.0 Volts) to the digit line D0, causing current to flow from the cell plate voltage DVC2, through the storage capacitor 14 and the activated NMOS transistor 28, and to the digit line D0. As this current flows, the storage capacitor 14 stores negative electric charge received from the digit line D0, causing a voltage VS2 on the capacitor 14 to decrease. When the voltage $V_{S2}$ equals the "0" bit voltage on the digit line D0, current stops flowing through the storage capacitor 14. A short time later, the DRAM array 10 de-energizes the word line WL1 to de-activate the NMOS transistor 28 and isolate the storage capacitor 14 from the digit line D0, thereby preventing the negative electric charge stored on the capacitor 14 from discharging back to the digit line D0.

The DRAM array 10 stores "1" and "0" bits in the memory cells 22 arranged along the complementary digit lines D0*, D1*, . . ., and Dn* in a manner similar to that described above, with the exception that the "1" bit voltage for these cells is approximately equal to the reference voltage V., and the "0" bit voltage equals the supply voltage $V_{CC}$.

The DRAM array 10 retrieves "1" and "0" bits stored in the manner described above in the memory cells 18, 20, 22, and 24 by discharging electric charges stored on the capacitors 12, 14, and 16 to the digit lines D0, D0*, D1, D1*, . . ., Dn, and Dn* and then detecting a change in voltage on the digit lines D0, D0*, D1, D1*, . . . , Dn, and Dn* resulting from the discharge with sense amplifiers (0), (1), . . . , and (n).

For example, the DRAM array 10 retrieves the "1" bit stored in the memory cell 18 by first equilibrating the voltages on the digit lines D0 and D0* to the cell plate voltage DVC2. The DRAM array 10 then energizes the word line WL0 to activate the NMOS transistor 26, causing the positive electric charge stored on the storage capacitor 12 to discharge through the activated transistor 26 to the digit line D0. As the positive electric charge discharges, the voltage on the digit line D0 rises by an amount $V_{SENSE}$ calculated as follows:

$$V_{SENSE}=(V_S-DVC2)*C_S/(C_D+C_S)$$

where $V_S$ is the voltage $V_{S1}$ on the capacitor 12, $C_S$ is the capacitance of the storage capacitor 12, and CD is the capacitance of the digit line D0. When the rise in voltage $V_{SENSE}$ on the digit line D0 causes a difference in voltages between the digit lines D0 and D0* to exceed a detection threshold (typically about 150 mVolts) of the sense amplifier (0), the sense amplifier (0) responds by driving the voltage on the digit line D0 to the supply voltage $V_{CC}$ and by driving the voltage on the digit line D0* approximately to the reference voltage $V_{SS}$. Input/output gating circuitry, DC sense amplifiers, and an output buffer (not shown) then transmit these voltages from the digit lines D0 and D0* to external circuitry as a "1" bit.

Likewise, the DRAM array 10 retrieves the "0" bit stored in the memory cell 20, for example, by first equilibrating the voltages on the digit lines D0 and D0 to the cell plate voltage DVC2. The DRAM array 10 then energizes the word line WL1 to activate the NMOS transistor 28, causing the negative electric charge stored on the storage capacitor 14 to discharge through the activated NMOS transistor 28 to the digit line D0. As the negative electric charge discharges, the voltage on the digit line D0 falls by an amount $V_{SENSE}$, calculated as described above, where $V_S$ is the voltage $V_{S2}$ on the capacitor 14 and $C_S$ is the capacitance of the storage capacitor 14. When the drop in voltage $V_{SENSE}$ on the digit line D0 causes the difference in voltages between the digit lines D0 and D0 to exceed the detection threshold of the sense amplifier (0), the sense amplifier (0) responds by driving the voltage on the digit line D0 approximately to the reference voltage $V_{SS}$ and by driving the voltage on the digit line D0\* to the supply voltage $V_{CC}$. The input/output gating circuitry, DC sense amplifiers, and output buffer then transmit these voltages from the digit lines D0 and D0\* to external circuitry as a "0" bit.

The DRAM array 10 retrieves "1" and "0" bits from the memory cells 22 arranged along the complementary digit lines D0\*, D1\*, . . . , and Dn\* in the same manner as described above.

DRAM arrays sometimes contain defective memory cells that are unable to reliably store "1" and "0" bits in the manner described above. In some instances, this occurs because the capacitance of the storage capacitors in these memory cells is too small, preventing the capacitors from retaining a sufficient electric charge to cause a change in voltage $V_{SENSE}$ on a digit line when discharged to the digit line that exceeds a sense amplifier's detection threshold. In other instances, this occurs because the electric charge stored on the storage capacitors in these memory cells leaks away through a variety of mechanisms, also preventing the capacitors from retaining a sufficient electric charge to cause a detectable change in voltage $V_{SENSE}$ on a digit line when discharged to the digit line. In either case, because the change in voltage $V_{SENSE}$ caused by discharging the electric charges stored by the storage capacitors in these memory cells cannot be detected by a sense amplifier, the "1" and "0" bits represented by the electric charges stored in these memory cells are unretrievable.

DRAM arrays are also sometimes unable to reliably store "1" and "0" bits in certain memory cells because the detection threshold of the cells' associated sense amplifier is too large for the sense amplifier to detect a change in voltage $V_{SENSE}$ caused by one of the cells discharging to the digit line. In this case as well, the "1" and "0" bits represented by the electric charges stored in these cells are unretrievable.

Generally, when DRAM arrays are found to be defective in this way, an attempt is made to repair the arrays by replacing defective memory cells and defective sense amplifiers in the arrays with redundant memory cells provided in redundant rows or columns in the arrays and with redundant sense amplifiers provided in the redundant columns.

Conventionally, when a redundant row is used to repair a DRAM array containing a defective memory cell, a row address that identifies the defective cell's row is permanently stored in the array by blowing selected fuses or anti-fuses in the array. Then, during normal operation of the DRAM array, if the array receives a request to access a memory cell having a memory address including a row address portion that corresponds to the stored row address, redundant circuitry in the array directs the array to access a redundant memory cell in the redundant row instead of accessing the memory cell identified by the received memory address. Since every memory cell in the defective cell's row has the same row address, every cell in the defective cell's row, both operative and defective, is replaced by a redundant memory cell in the redundant row.

Similarly, when a redundant column is used to repair a DRAM array containing a defective memory cell, a column address that identifies the defective cell's column is permanently stored in the array by blowing selected fuses or anti-fuses in the array. Then, during normal operation of the DRAM array, if the array receives a request to access a memory cell having a memory address including a column address portion that corresponds to the stored column address, redundant circuitry in the array directs the array to access a redundant memory cell in the redundant column instead of accessing the memory cell identified by the received memory address. Since every memory cell in the defective cell's column has the same column address, every cell in the defective cell's column, both operative and defective, is replaced by a redundant memory cell in the redundant column.

The process described above for repairing a DRAM array using redundant rows and columns is well known in the art, and is described in various forms in U.S. Pat. Nos. 4,459,685, 4,601,019, 5,422,850 and 5,528,539.

Because the conventional repair process described above uses an entire redundant row or column to repair each defective memory cell in a DRAM or other memory array, the number of defective memory cells that can be repaired in an array is limited by the number of redundant rows or columns in the array, which in turn is limited by the space available in the array for redundant rows or columns. As a result, it is not uncommon for defective DRAM and other memory arrays to be discarded because the conventional repair process cannot repair the quantity of defective memory cells they contain. This problem is often exacerbated by the discovery of defective redundant memory cells in the available redundant rows or columns. Obviously, it would be preferable to be able to repair these defective arrays rather than discard them.

Therefore, there is a need in the art for an improved device and method for repairing DRAM arrays and other memory arrays. Such an improved device and method should be applicable to arrays containing memory cells that are unable to reliably store "1" and "0" bits because their storage capacitors do not retain a sufficient electric charge, or because their associated sense amplifiers have a detection threshold that is too large.

SUMMARY

The present invention provides an apparatus for repairing a memory array, such as a DRAM array, that includes a pair of complementary digit lines through which memory cells activated by word lines selected in accordance with row addresses are accessed. The array may need repair, for example, when a memory cell in the array is unable to properly store "1" and "0" bits because the charge it retains representing a bit is not sufficient to cause a detectable change in voltage on one of the digit lines when discharged to the digit line.

When repair is needed, enabling circuitry (e.g., fuses or anti-fuses) in the apparatus enables repair of the array, and word line energizing circuitry (e.g., a row decoder) responsive to the enabling circuitry energizes more than one word line in the array in accordance with each row address so more than one memory cell is accessed through the digit lines for each row address. As a result, the apparatus stores a single "1" or "0" bit as a charge in multiple memory cells. Then, when the apparatus retrieves the single bit, the bit's representative charges stored in the multiple memory cells are discharged to the digit lines to cause a change in voltage on the digit lines that is greater than, and therefore more likely to be detectable than, a change in voltage on the digit lines caused by discharging a representative charge stored in a single memory cell to the digit lines in the conventional manner.

In other embodiments of the present invention, a memory system, an integrated circuit die, and a semiconductor wafer include the repair apparatus and memory array described above. In another embodiment, all electronic system includes input, output, processor, and memory devices, and the memory device includes the repair apparatus and memory array described above.

In a further embodiment, the present invention provides an apparatus for repairing a memory array. The memory array is of the type in which stored bits are read by detecting a change in voltage between two conductors caused by sharing a charge stored in a memory cell in the array with one of the conductors. The apparatus repairs the array when some memory cells in the array cannot retain a sufficient charge to cause a detectable change in voltage on one of the conductors. The apparatus includes circuitry directing each memory cell in a group of cells in the array to store a charge representing a single stored bit and, when the single stored bit is being read, to share its stored charge with one of the conductors.

In a still further embodiment, the present invention provides an apparatus for repairing a memory array. The memory array is of the type in which stored bits are accessed by using sense amplifiers to detect a change in voltage between two conductors caused by sharing a charge stored in a memory cell in the array with one of the conductors. The apparatus repairs the array when some of the sense amplifiers in the array cannot detect a change in voltage on one of the conductors caused by sharing a charge stored in one of the memory cells with one of the conductors. The apparatus includes circuitry directing each memory cell in a group of cells in the array to store a charge representing a single stored bit and, when the single stored bit is being accessed, to share its stored charge with one of the conductors.

In an additional embodiment, a memory system includes a memory array including pairs of complementary digit lines, alternating even and odd word lines, and memory cells controlled by the word lines and accessed through the digit lines. Address buffers receive memory addresses and output corresponding row and column addresses, and row decoder circuitry energizes at least two word lines in accordance with each row address. A column decoder outputs a column select signal in accordance with each column address, and sense amplifier and input/output gating circuitry selects a pair of complementary digit lines in the array in accordance with each column select signal. As a result, two or more memory cells that are each controlled by one of the energized word lines are accessed through one of the selected digit lines. A data buffer provides communication between the accessed memory cells and external circuitry.

In a further embodiment, a memory system includes a memory array including pairs of complementary digit lines, word lines, and memory cells controlled by the word lines and accessed through the digit lines. Address buffers receive multiplexed memory addresses in the form of a first plurality of address bits followed in time by a second plurality of address bits. The address buffers also output a row address and a first portion of a column address corresponding to each memory address' associated first plurality of address bits, and output a second portion of the column address corresponding to each memory address' associated second plurality of address bits. Row decoder circuitry energizes at least two word lines in accordance with each row address, and a column decoder outputs a column select signal in accordance with the first and second portions of each column address. Sense amplifier and input/output gating circuitry selects a pair of complementary digit lines in the array in accordance with each column select signal so at least two memory cells controlled by the energized word lines are accessed through one of the selected digit lines. As a result, the accessed memory cells together may store or output a single memory bit to external circuitry. A data buffer provides communication between the accessed memory cells and external circuitry.

In a still further embodiment, a memory system includes a memory array including pairs of complementary digit lines, word lines, and memory cells controlled by the word lines and accessed through the digit lines. Row address bit terminals receive a first plurality of address bits associated with a non-multiplexed memory address, and column address bit terminals receive a second plurality of address bits associated with the non-multiplexed memory address. Address buffers output a row address corresponding to a first portion of the first plurality of address bits and output a column address corresponding to both the second plurality of address bits and a second portion of the first plurality of address bits. Row decoder circuitry energizes at least two word lines in accordance with the row address, and a column decoder outputs a column select signal in accordance with the column address. Sense amplifier and input/output gating circuitry selects a pair of complementary digit lines in the array in accordance with the column select signal. As a result, at least two memory cells controlled by the energized word lines are accessed through one of the selected digit lines. A data buffer provides communication between the accessed memory cells and external circuitry.

In a still additional embodiment, a method for storing a bit in a memory array having a plurality of memory cells each coupled to one of a pair of complementary digit lines includes providing a charge representing the bit on each of the digit lines, storing the charge provided on one of the digit lines in at least one of the memory cells, and storing the charge provided on one of the digit lines in at least one other of the memory cells.

In another embodiment, a method of testing a repair for a memory array of the type to store a bit by storing a charge in a memory cell, and also of the type to access the bit by sharing the stored charge with one of two conductors and then detecting a resulting change in voltage between the conductors, comprises: directing the memory cells in a group of memory cells in the memory array to each store the same bit by each storing a charge representing the bit; directing each memory cell in the group of memory cells to share its stored charge with one of the conductors; and attempting to detect a change in voltage between the conductors resulting from the memory cells in the group sharing their stored charges with the conductors.

DETAILED DESCRIPTION

In general, the present invention provides an improved device and method for repairing Dynamic Random Access Memory (DRAM) arrays and other memory arrays. The device and method repair arrays that, for example, contain memory cells that are defective as a result of being unable to retain an electric charge representing a "1" or "0" bit that is sufficient to cause a detectable change in voltage on a digit line when discharged to the digit line.

The device and method store an electric charge representing an individual "1" or "0" bit in multiple memory cells in an array that share a pair of complementary digit lines. When a bit stored in this inventive manner is retrieved, the electric charges stored in the multiple memory cells are discharged to the pair of digit lines, causing a detectable change in voltage on the digit lines. The device and method thus "gang" memory cells together to repair an array.

Figure 1:
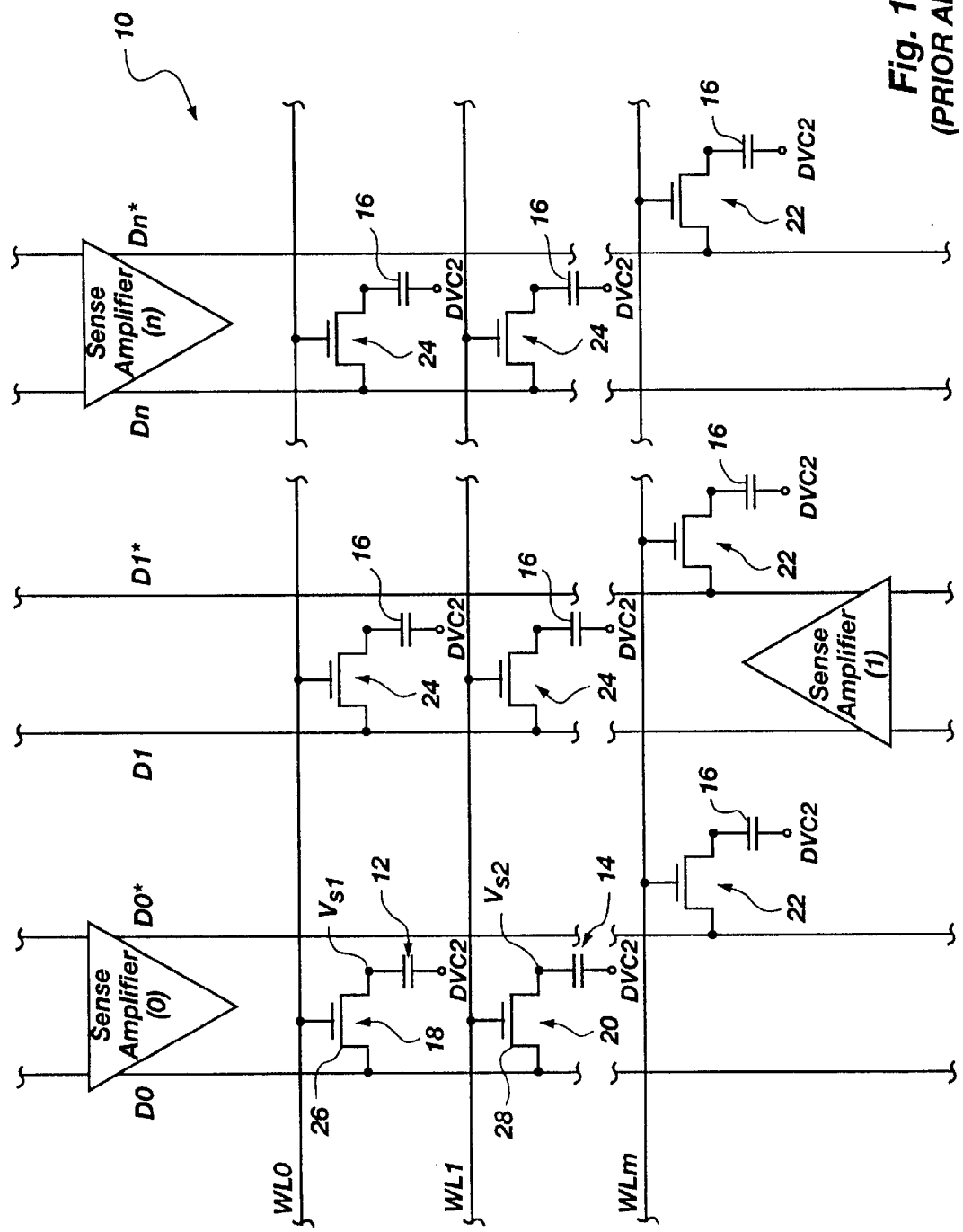
FIG. 1 is a schematic of a conventional dynamic random access memory array.
Figure 2:
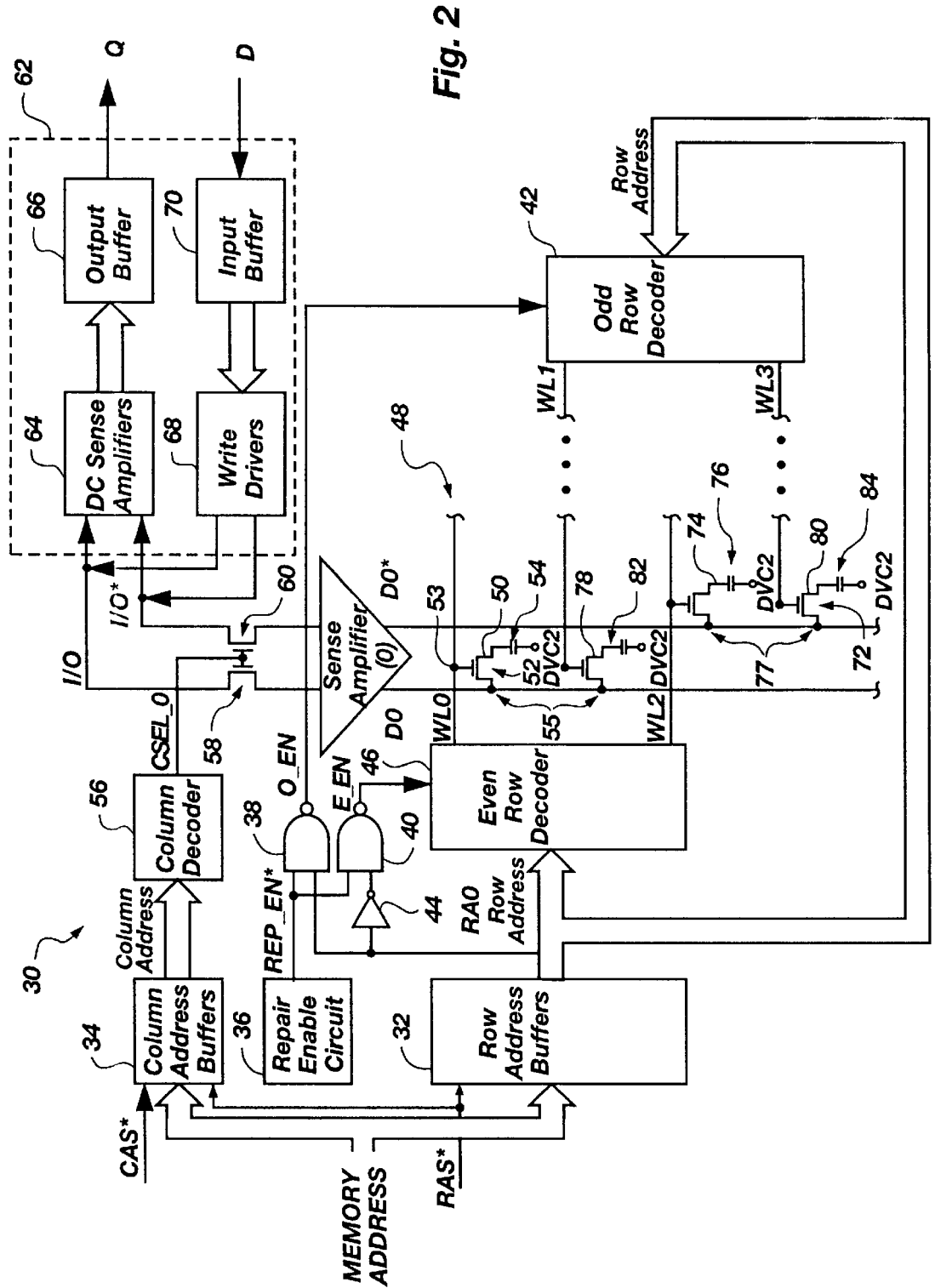
FIG. 2 is a block diagram and schematic of a memory system in accordance with the present invention.

More particularly, as shown in FIG. 2, an inventive memory system 30 includes row and column address buffers 32 and 34 receiving a multiplexed Memory Address, a row address strobe signal RAS*, and a column address strobe signal CAS*. It will be understood by those having skill in the field of this invention that the address buffers 32 and 34 may comprise any circuitry for buffering memory addresses, including, for example, pre-decoders and array buffers. Also, it will be understood that the present invention is applicable to memory systems receiving any number of address bits in any configuration, including both multiplexed and non-multiplexed addressing schemes. Further, as used herein, a "multiplexed" Memory Address is an address that is provided to a memory system in the form of a first plurality of address bits (e.g., the row address bits in a typical DRAM system) followed in time by a second plurality of address bits (e.g., the column address bits in a typical DRAM system).

The memory system 30 operates in both an unrepaired state and a repaired state. In its unrepaired state, in response to RAS* being activated, the row address buffers 32 operate in a well known manner to latch in a first plurality of address bits A0, A1, . . ., and Az from the Memory Address and then output a corresponding Row Address that includes row address bits RA0, RA1, . . ., RAz. A sense amplifier (0) also equilibrates voltages on a pair of complementary digit lines D0 and D0* to the cell plate voltage DVC2.

In addition, a repair enable circuit 36 is configured in the unrepaired state to allow normal operation of the memory system 30 by outputting a high, inactive repair enable signal REP_EN* to inputs of first and second NAND gates 38 and 40. As a result, when the row address bit RA0 is high, the NAND gate 38 outputs a low, inactive odd row decoder enabling signal O_EN to disable an odd row decoder 42 and, at the same time, an inverter 44 outputs a low, causing the NAND gate 40 to output a high, active even row decoder enabling signal E_EN to enable an even row decoder 46. The enabled even row decoder 46 then energizes one of a plurality of even word lines (i.e., rows) WL0 and WL2 in a DRAM array 48 selected in accordance with the row address bits RA1, . . . , Raz in a well known manner.

When, instead, the row address bit RA0 is low, the NAND gate 38 outputs a high, active odd row decoder enabling signal O_EN to enable the odd row decoder 42 and, at the same time, the inverter 44 outputs a high, causing the NAND gate 40 to output a low, inactive even row decoder enabling signal E_EN to disable the even row decoder 46. The enabled odd row decoder 42 then energizes one of a plurality of odd word lines WL1 and WL3 selected in accordance with the row address bits RA1, . . . , Raz in a well known manner.

As will be described in more detail below with respect to FIGS. 3A, 3B, and 3C, the repair enable circuit 36 may comprise any circuitry for enabling repair of an array, including, for example, fuses or anti-fuses. Also, as used herein, "configure," "configuring," and "configured" include both an affirmative act with respect to a circuit (e.g., blowing a fuse or an anti-fuse) and the absence of an affirmative act with respect to the circuit (e.g., not blowing a fuse or an anti-fuse). Further, it will be understood that the present invention is not limited to enabling circuitry including the repair enable circuit 36 and NAND gates 38 and 40. Rather, the present invention includes within its scope any circuitry capable of enabling repair of an array. In addition, it will be understood that the row decoders 42 and 46 may comprise any word line energizing circuitry, including, for example, phase drivers and word line drivers. Still further, it will be understood that while only four word lines are shown in FIG. 2 for purposes of clarity, any number of word lines will work for purposes of the present invention. Also, it will be understood that while the present invention is described with respect to the DRAM array 48, the present invention is applicable to other memory arrays.

If, for example, the even word line WL0 is energized as described above in the unrepaired state of the memory system 30, the energized even word line WL0 activates an NMOS transistor 50 in a memory cell 52 in the array 48 through a control terminal 53 of the NMOS transistor 50. Of course, while the array 48 is shown in FIG. 2 as having only four memory cells for clarity, it will be understood that the array 48 includes millions of memory cells, and that the present invention is applicable to arrays including any number of memory cells.

As a result of the NMOS transistor 50 being activated, a storage capacitor 54 storing a positive electric charge representing a "1" bit, for example, is connected to the digit line D0 through the activated NMOS transistor 50 and an access terminal 55 (e.g., a digit line contact). Of course, while only one pair of complementary digit lines D0 and D0*, and only one sense amplifier (0), are shown in FIG. 2 for clarity, it will be understood that the DRAM array 48 includes a multitude of digit lines and sense amplifiers, and that the present invention includes within its scope any number of digit lines and sense amplifiers.

When the storage capacitor 54 is connected to the digit line D0 through the activated NMOS transistor 50 and the access terminal 55, the capacitor 54 discharges its positive electric charge to the digit line D0. As a result, a voltage on the digit line D0 rises by $V_{SENSE}$ as calculated above. During the same period of time, in response to CAS* being activated, the column address buffers 34 operate in a well known manner to latch in a second plurality of address bits A0, A1, . . . , and Az from the Memory Address and then output a corresponding Column Address to a column decoder 56.

If the positive electric charge stored in the storage capacitor 54 is sufficient for $V_{SENSE}$ to exceed a detection threshold of the sense amplifier (0), the sense amplifier (0) detects the change in voltage $V_{SENSE}$ and, in response, drives the digit line D0 to the supply voltage $V_{CC}$ and the digit line D0* approximately to the reference voltage $V_{SS}$. The column decoder 56 then energizes a column select signal CSEL_0 selected in accordance with the Column Address in a well known manner, thereby activating a pair of input/output gating NMOS transistors 58 and 60. As a result, the voltages on the digit lines D0 and D0* are transferred through an input/output bus <I/O, I/O*>to a data buffer 62 including well known DC sense amplifiers 64, an output buffer 66, write drivers 68, and an input buffer 70. The data buffer 62 then outputs the "1" bit as an output data signal Q to external circuitry (not shown). Of course, it will be understood that the present invention is not limited to data buffers including DC sense amplifiers, output buffers, write drivers, and input buffers. if, instead, the positive electric charge stored in the storage capacitor 54 is insufficient for $V_{SENSE}$ to exceed the detection threshold of the sense amplifier (0), or the detection threshold of the sense amplifier (0) is too large, the sense amplifier (0) does not detect the change in voltage $V_{SENSE}$, and the voltages on the digit lines D0 and D0\* do not separate as desired. As a result, the "1" bit (and any other bit) stored on the storage capacitor 54 is unretrievable, and the memory system 30 requires repair.

If only a few memory cells in the memory system 30 require repair, conventional methods using redundant rows and columns to replace these memory cells may work to repair the memory system 30. For example, the word line WL3 may comprise a redundant word line so that the failing memory cell 52 is replaced with a memory cell 72 along the word line WL3. However, as described above, conventional methods are not always successful.

Refresh counter circuitry 73, such as a CBR (CAS Before RAS) refresh counter, is operative in a well-known manner in the unrepaired state of the memory system 30.

Repair of the memory system 30 is enabled in accordance with the present invention by configuring the repair enable circuit 36 to output a low, active repair enable signal REP_EN\* to inputs of the first and second NAND gates 38 and 40. As a result, the first NAND gate 38 outputs a high, active odd row decoder enabling signal O_EN to enable the odd row decoder 42. At the same time, the second NAND gate 40 also outputs a high, active even row decoder enabling signal E_EN to enable the even row decoder 46.

In the repaired state of the memory system 30, in response to RAS\* being activated, the row address buffers 32 operate in the same well known manner to latch in the first plurality of address bits A0, A1, . . . , and Az from the Memory Address and then output a corresponding Row Address that includes row address bits RA0, RA1, . . . , RAz. The sense amplifier (0) also equilibrates the voltages on the digit lines D0 and D0\* to the cell plate voltage DVC2.

Because the even row decoder 46 is enabled in the repaired state of the memory system 30 as described above, it energizes an even word line WL0 or WL2 selected in accordance with the row address bits RA1, . . . , RAz. As a result, the NMOS transistor 50 or an NMOS transistor 74 is activated, connecting the storage capacitor 54 or a storage capacitor 76, respectively, to the respective digit line D0 or D0\* through the activated NMOS transistor 50 or 74 and the access terminal 55 or an access terminal 77 (e.g., a digit line contact). At the same time, because the odd row decoder 42 is also enabled in the repaired state, it energizes an odd word line WL1 or WL3 also selected in accordance with the row address bits RA1, . . ., RAz. As a result, an NMOS transistor 78 or 80 is activated, connecting a respective storage capacitor 82 or 84 to the respective digit line D0 or D0\* through the activated NMOS transistor 78 or 80 and the respective access terminal 55 or 77.

With two of the storage capacitors 54, 76, 82, and 84 each connected to one of the digit lines D0 and D0\* as described above, the memory system 30 can store a "1" or "0" bit on the connected capacitors. To store a "1" bit, for example, received by the input buffer 70 as an input data signal D, the input buffer 70 directs the write drivers 68 to drive the input/output bus <I/O, I/O\*> to the supply voltage $V_{CC}$(I/O) and approximately to the reference voltage $V_{SS}$(I/O\*). During the same period of time, in response to CAS\* being activated, the column address buffers 34 operate in the same well known manner to latch in the second plurality of address bits A0, A1, . . . , Az from the Memory Address and output a corresponding Column Address to the column decoder 56. In response, the column decoder 56 energizes the column select signal CSEL_0 selected in accordance with the Column Address, thereby activating the input/output gating NMOS transistors 58 and 60 and conducting the input/output bus <I/O, I/O\*> voltages to the sense amplifier (0). The sense amplifier (0) responds by driving the digit lines D0 and D0\* to the respective supply voltage $V_{CC}$ and reference voltage $V_{SS}$. These voltages are then stored as described above on the two of the storage capacitors 54, 76, 82, and 84 that are each connected to one of the digit lines D0 and D0\*.

Of course, the memory system 30 can also retrieve a "1" or "0" bit stored on two of the storage capacitors 54, 76, 82, and 84. To do so, the even and odd row decoders 46 and 42 respectively energize one of the even word lines WL0 and WL2 and one of the odd word lines WL1 and WL3 each selected in accordance with the row address bits RA1, . . . , RAz as described above. As a result, for example, positive electric charges representing a "1" bit stored on the storage capacitors 54 and 82 may discharge through respective NMOS transistors 50 and 78 activated by respective energized word lines WL0 and WL1. These discharging positive electric charges raise the voltage on the digit line D0 by $V_{SENSE}$ as described above, except that the rise in voltage $V_{SENSE}$ is greater than it would have been had the "1" bit been stored in the conventional manner as a charge on only one of the storage capacitors 54, 76, 82, and 84. This "greater" $V_{SENSE}$ is, of course, more likely to exceed the detection threshold of the sense amplifier (0) and to thereby be detected. As a result, the "1" bit may be successfully retrieved through the sense amplifier (0), the input/output gating NMOS transistors 58 and 60, the input/output bus <I/O, I/O\*>, and the data buffer 62 in the manner described above. Thus, the memory system 30, including any previously defective memory cells, is repaired.

It should be understood that the present invention works with two or more memory cells connected to the same digit line D0 or D0\*, for example, as described above, and with one or more memory cells connected to the digit line D0 and one or more memory cells connected to the digit line D0\*. Further, it should be understood that while the memory system 30 has been described as including both odd and even row decoders 42 and 46, the present invention includes within its scope any decoding circuitry capable of energizing two or more word lines in accordance with each Memory Address. In addition, it should be understood that the present invention includes within its scope the energizing of a different number of word lines for different row addresses (e.g., energizing two word lines for a first row address and four word lines for a second row address). Such a scheme may be desirable where more memory cells are necessary to repair an array in some locations than in others.

It should also be understood that the memory system 30 has less total storage capacity in its repaired state than in its unrepaired state. For example, if the memory system 30 is provided in a 16 Megabit X 1 configuration in its unrepaired state, it has $2^{12}$ uniquely addressable word lines (i.e., rows) and $2^{12}$ uniquely addressable pairs of digit lines (i.e., columns) for a total of $2^{24}$ uniquely addressable locations (i.e., memory cells). If the memory system 30 is then repaired in accordance with the present invention by enabling the accessing of two memory cells for each received memory address, the repaired memory system 30 has $2^{11}$ uniquely addressable pairs of word lines and $2^{12}$ uniquely addressable pairs of digit lines for a total of $2^{23}$ uniquely addressable locations (i.e., pairs of memory cells). As a result, the repaired memory system 30 is in an 8 Megabit X 1 configuration. If, instead, the memory system 30 is repaired by enabling the accessing of four memory cells for each received memory address, the repaired memory system 30 has $2^{10}$ uniquely addressable groups of four word lines and $2^{12}$ uniquely addressable pairs of digit lines for a total of $2^{22}$ uniquely addressable locations (i.e., groups of four memory cells). As a result, the repaired memory system 30 is in a 4 Megabit X 1 configuration. Of course, in order to enable the accessing of four memory cells for each received memory address, the even and odd row decoders 46 and 42 are each configurable with, for example, fuses or anti-fuses, to select and energize two word lines in accordance with each row address.

It will be understood that, as used herein, "accessing" a memory cell means energizing a conductor, such as a word line, connected to an access terminal of the cell, and then sensing a resulting change in voltage on the conductor using a sense amplifier. The term "accessing" thus includes both refreshing and reading a memory cell.

Since the 4 Megabit X 1 configuration produced in the above example by grouping four word lines together for each memory address is an industry standard configuration and the 8 Megabit X 1 configuration is not, it can be seen that it can be advantageous to group four word lines together when repairing the memory system 30 in accordance with the present invention. This allows 256 Megabit arrays to be recovered (i.e., repaired) as industry standard 64 Megabit arrays, 64 Megabit arrays to be recovered as industry standard 16 Megabit arrays, 16 Megabit arrays to be recovered as industry standard 4 Megabit arrays, 4 Megabit arrays to be recovered as industry standard 1 Megabit arrays, etc. Of course, the same advantageous principle applies to grouping sixteen, sixty-four, etc. word lines together when repairing the memory system 30 in accordance with the present invention.

Of course, 8 Megabit, 32 Megabit, 128 Megabit, etc. configurations can be useful, for example, in producing standard Single In-Line Memory Module (SIMM) upgrade configurations.

However, continuing with the above example, if the unrepaired memory system 30 having a 16 Megabit X 1 configuration is to be recovered in accordance with the present invention in a 4 Megabit X 1 configuration, it is necessary that the column address buffers 34 continue to receive the twelve address bits with each memory address that they received in the 16 Megabit X 1 configuration. This is because in both the unrepaired 16 Megabit X 1 configuration and the repaired 4 Megabit X 1 configuration, the memory system 30 has $2^{12}$ uniquely addressable pairs of digit lines. Allowing the column address buffers 34 to continue to receive twelve address bits in the repaired 4 Megabit X 1 configuration can be problematic, though, because standard die packages for 4 Megabit X 1 dice include only eleven address bit terminals.

Therefore, still continuing with the above example, in the repaired 4 Megabit X 1 configuration, the column address buffers 34 in the memory system 30 are preferably configurable with, for example, fuses or anti-fuses, to latch in an address bit in the first eleven address bits from the Memory Address in response to RAS* being activated. At the same time, of course, the row address buffers 32 latch in the other ten address bits from the Memory Address in response to RAS* being activated in order to be able to uniquely address the $2^{10}$ groups of four word lines in the memory system 30. Later, in response to CAS* being activated, the column address buffers 34 latch in the second eleven address bits from the Memory Address in order to have a total of twelve address bits from the Memory Address to uniquely address the $2^{12}$ pairs of complementary digit lines in the memory system 30.

Of course, it should be understood that the refresh counter circuitry 73 of the memory system 30 may be configured with fuses, anti-fuses, or the like to output row addresses in the repaired state of the memory system 30 which correspond appropriately to those addresses output by the row address buffers 32.

Figure 3A:
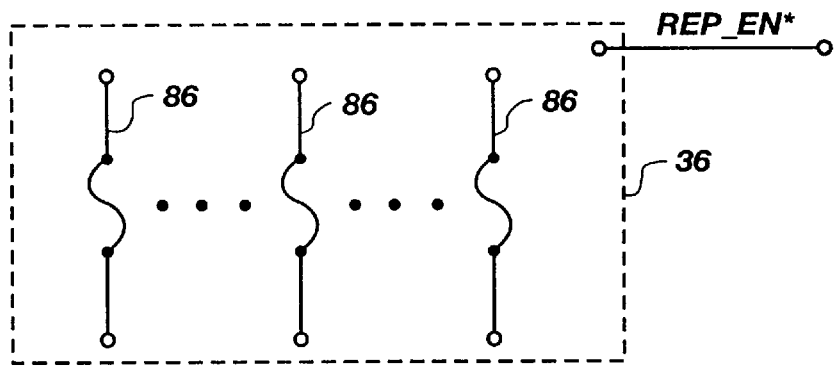
FIGS. 3A, 3B, and 3C are schematics of alternative versions of a repair enable circuit in the memory system of FIG. 2.
Figure 3B:
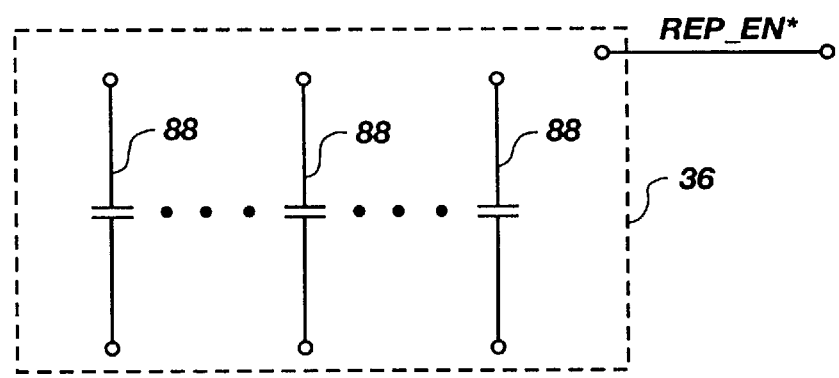
Figure 3C:

As shown in FIG. 3A, the repair enable circuit 36 includes a plurality of fuses 86 that are configurable to cause the repair enable circuit 36 to output the low, active repair enable signal REP_EN*. The fuses 86 may be configured in a well known manner by laser or electric current. As shown in FIG. 3B, the repair enable circuit 36 includes a plurality of anti-fuses 88 that are also configurable to cause the repair enable circuit 36 to output the low, active repair enable signal REP_EN*. The anti-fuses 88 may be configured in a well known manner with a programming voltage. As shown in FIG. 3C, the repair enable circuit 36 is configurable in response to a test mode enable signal TEST_EN from external circuitry (not shown) to cause the repair enable circuit 36 to output the low, active repair enable signal REP_EN*. Such a configuration is desirable so repair of an array in accordance with the present invention may be tested in a temporary manner before it is implemented in a permanent manner using fuses, anti-fuses, or the like.

Figure 4:
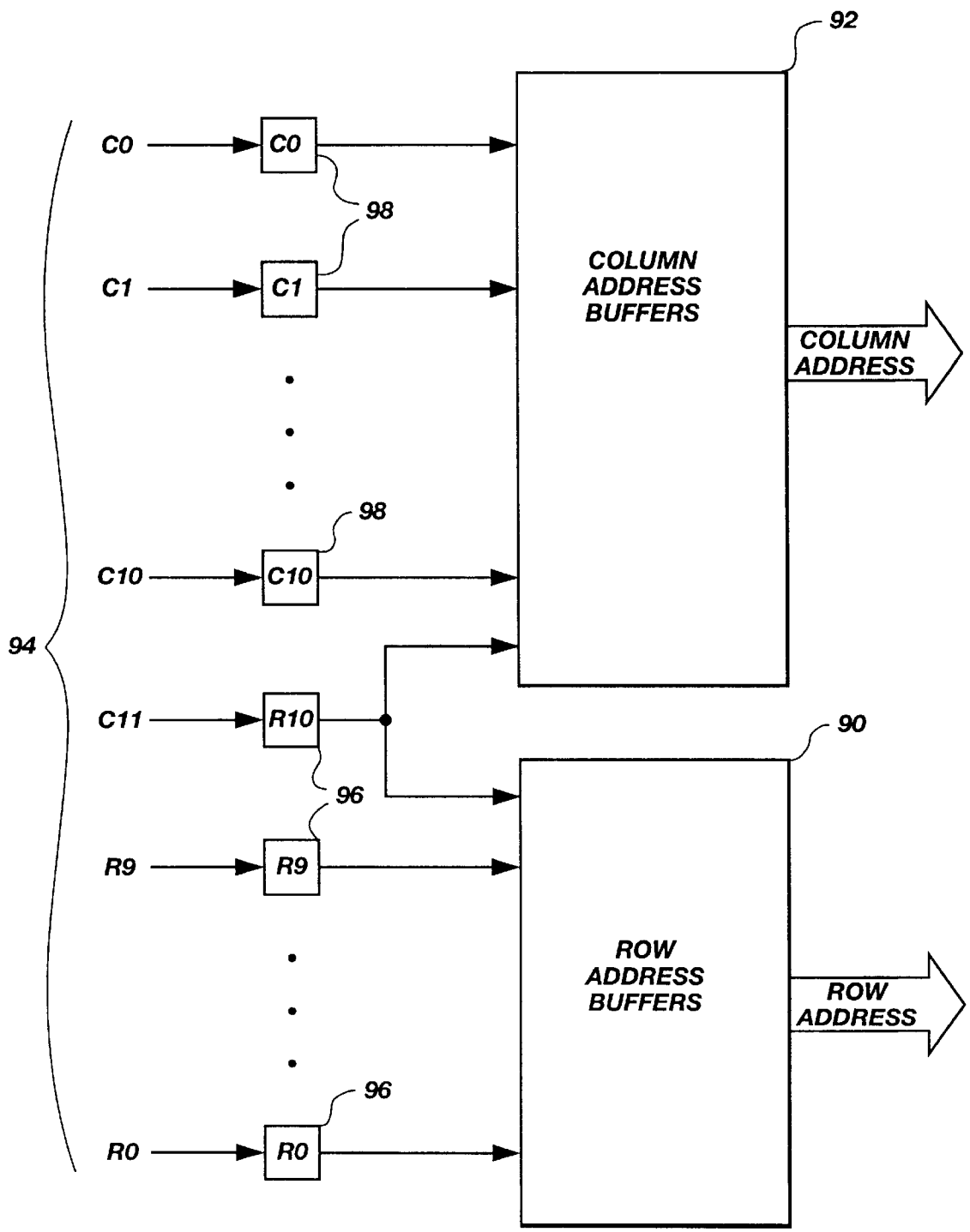
FIG. 4 is a block diagram of a modified version of the memory system of FIG. 2.

A modified version of the memory system 30 of FIG. 2 is shown in FIG. 4. In this modified version, row and column address buffers 90 and 92 receive a non-multiplexed memory address 94 in the repaired, 4 Megabit X 1 state of the memory system 30. The memory address 94 includes row address bits R0, . . . , and R9 provided through row address bit die bond pads 96 and column address bits C0, C1, . . . , C11 provided through column address bit die bond pads 98 and one of the row address bit bond pads 96. As a result, the column address buffers 92 receive the twelve address bits necessary to uniquely address the $2^{12}$ pairs of digit lines in the memory system 30, and the row address buffers 90 receive the ten address bits necessary to uniquely address the $2^{10}$ groups of four word lines in the memory system 30. At the same time, the memory system 30 is recovered from its unrepaired 16 Megabit X 1 configuration in a repaired 4 Megabit X 1 configuration that is pin compatible with the eleven standard pins in 4 Megabit die packages. Of course, it will be understood that the unrepaired, 16 Megabit X 1 configuration and repaired, 4 Megabit X 1 configuration for the memory system 30 described above are only examples, and that the present invention is therefore not so limited.

Figure 5:
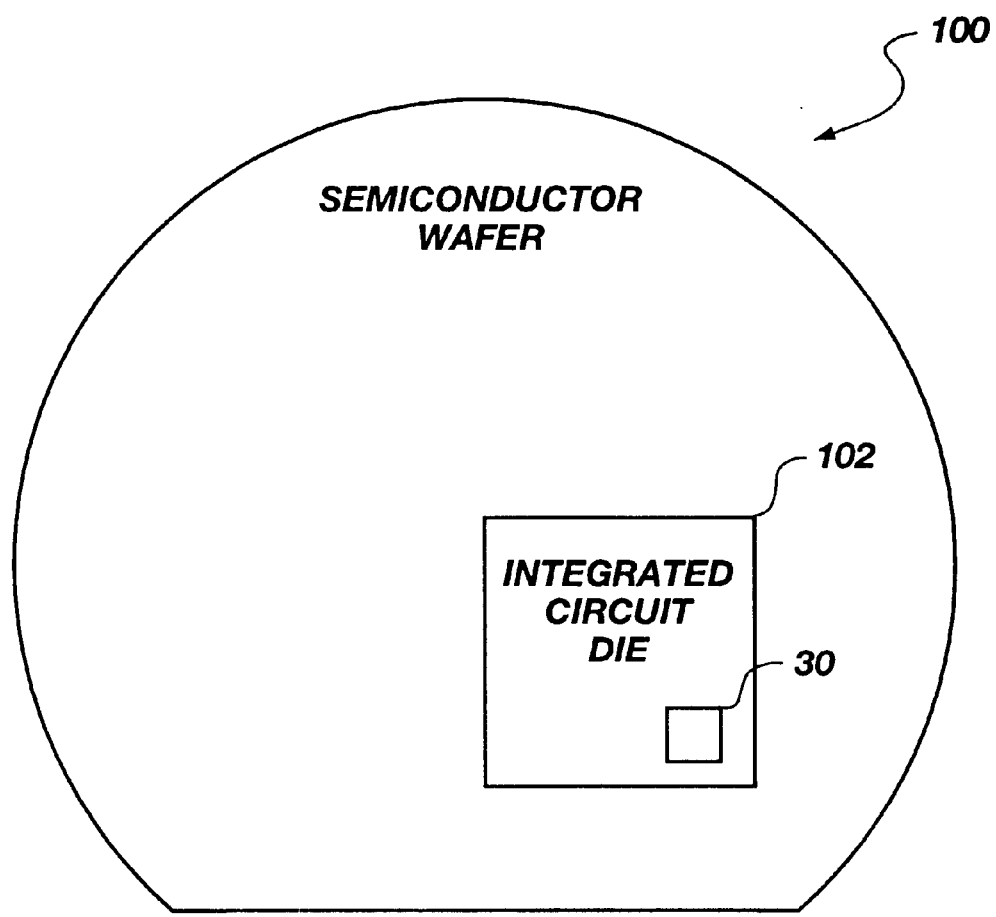
FIG. 5 is a diagram of a semiconductor wafer including an integrated circuit die incorporating the memory system of FIG. 2.

As shown in FIG. 5, a semiconductor wafer 100 includes a yet-to-be cut integrated circuit die 102 that incorporates the memory system 30 of FIG. 2.

Figure 6:
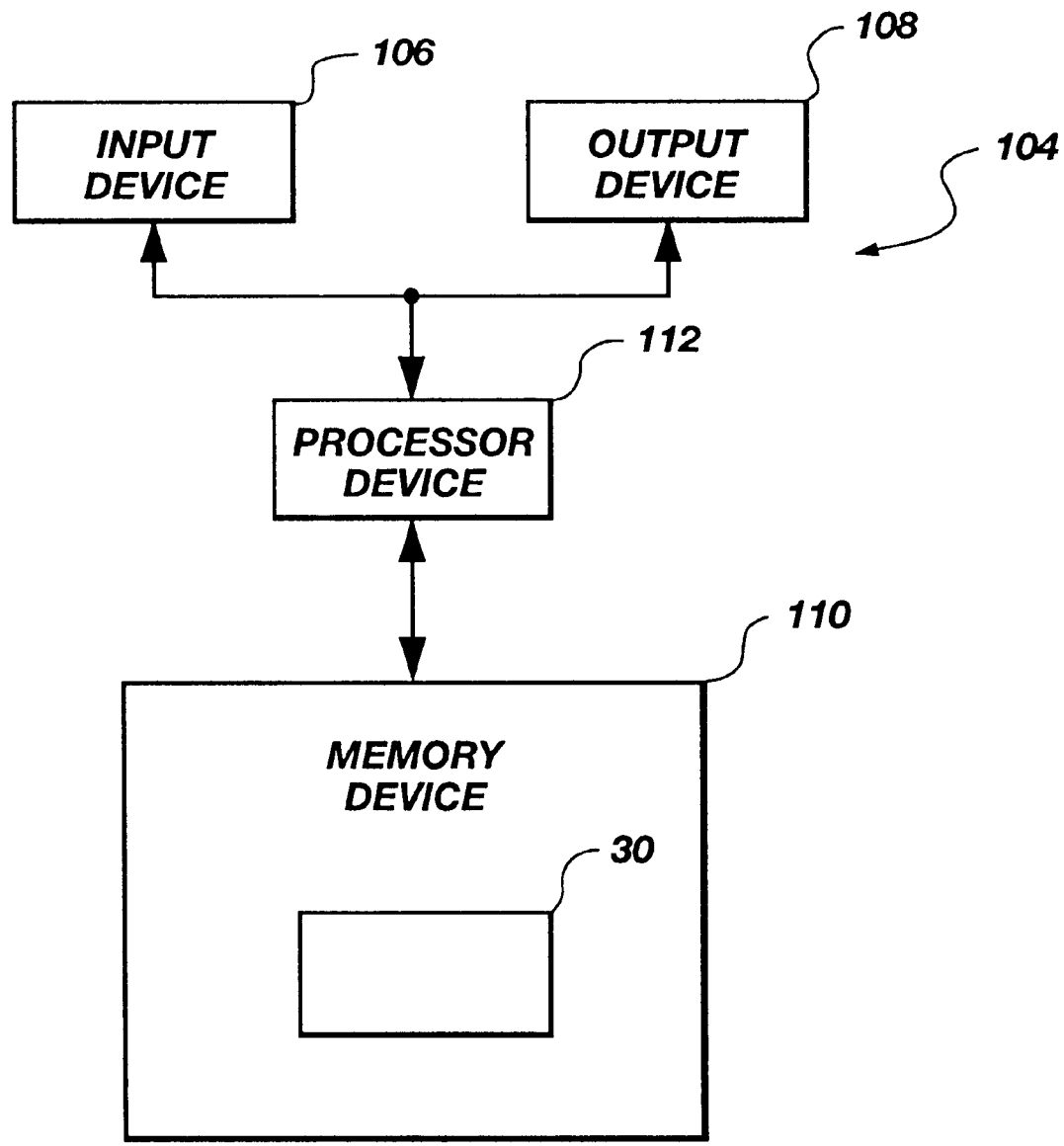
FIG. 6 is a block diagram of an electronic system including a memory device incorporating the memory system of FIG. 2.

As shown in FIG. 6, an electronic system 104 includes an input device 106, an output device 108, and a memory device 110, all coupled to a processor device 112. The memory device 110 incorporates the memory system 30 of FIG. 2.

The present invention thus provides an improved device and method for repairing DRAM and other memory arrays. By grouping two or more word lines together for each memory address, the present invention when applied to a DRAM array effectively halves the time it takes to refresh the array. The present invention also reduces the time $T_{RAC}$ in a DRAM array from the activation of RAS* to the outputting of valid data because the greater charge applied by the present invention to the array's digit lines for each "1" or "0" bit retrieved from the array allows the sense amplifiers in the array to more quickly detect a bit being retrieved. Further, the greater charge applied by the present invention to a DRAM array's digit lines for each "1" or "0" bit retrieved from the array makes the retrieval of bits from the array less sensitive to fluctuations in the supply voltage $V_{CC}$ and the reference voltage $V_{SS}$.

Although the present invention has been described with reference to a particular embodiment, the invention is not limited to this described embodiment. For example, it should be understood that while the described embodiment has been described with respect to memory cells activated in accordance with row addresses and accessed in accordance with column addresses, the present invention is equally applicable to memory systems in which the memory cells are activated in accordance with column addresses and accessed in accordance with row addresses. Therefore, the invention is limited only by the appended claims, which include within their scope all equivalent devices or methods which operate according to the principles of the invention as described.

What is claimed is:

1. A method for storing a bit in a memory array having a plurality of memory cells each coupled to one of a pair of complementary digit lines, the method comprising:

connecting at least two memory cells in a memory array having a plurality of memory cells to one digit line of a pair of complementary digit lines;

connecting at least two other memory cells in a memory array having a plurality of memory cells to the other digit line of a pair of complementary digit lines;

providing a charge representing the bit on each digit line of the complementary pair of digit lines;

storing the charge provided on one digit line of the complementary pair of digit lines in at least two memory cells connected to the one digit line of the complementary pair of digit lines; and storing the charge provided on the other digit line of the complementary pair of digit lines in another at least two of the memory cells.

* * * * *

UNITED STATES PATENT AND TRADEMARK OFFICE
CERTIFICATE OF CORRECTION

PATENT NO : 5,953,266
DATED : September 14, 1999
INVENTOR(S) : Shore

It is certified that error appears in the above-identified patent and that said Letters Patent are hereby corrected as shown below:

| | | |
|---|---|---|
| Column 1, | line 12, | delete "," after "repair" (first occurrence); |
| Column 1, | line 41, | after "the" insert --DRAM--; |
| Column 1, | line 53, | after "the" (first occurrence) insert --storage--; |
| Column 1, | line 55, | after "the" insert --storage--; |
| Column 1, | line 60, | before "capacitor" insert --storage--; |
| Column 2, | line 4, | change "VS2" to --$V_{S2}$--; and after "the" (second occurrence) insert --storage--; |
| Column 2, | line 11, | after "the" insert --storage--; |
| Column 2, | line 18, | delete "V.," and insert --$V_{ss}$,-- therefor; |
| Column 2, | line 34, | after "activated" insert --NMOS--; |
| Column 2, | line 41, | after "the" (second occurrence) insert --storage--; |
| Column 2, | line 42, | delete "CD" and insert --$C_D$-- therefor; |
| Column 2, | line 56, | delete "D0" (second occurrence) insert --D0*-- therefor; |
| Column 2, | line 64, | after "the" (first occurrence) insert --storage--; |
| Column 2, | line 67, | delete "D0" (second occurrence) insert --D0*-- therefor; |
| Column 4, | line 66, | delete "all" and insert --an-- therefor; |
| Column 7, | line 54, | change "Raz" to --RAz--; |
| Column 7, | line 63, | change "Raz" to --RAz--; |
| Column 8, | line 24, | after "the" insert --DRAM--; |
| Column 8, | line 26, | after "the" insert --DRAM--; |
| Column 8, | line 27, | after "the" insert --DRAM--; |
| Column 8, | line 44, | after "the" insert --storage--; |

UNITED STATES PATENT AND TRADEMARK OFFICE
CERTIFICATE OF CORRECTION

PATENT NO : 5,953,266
DATED : September 14, 1999
INVENTOR(S) : Shore

It is certified that error appears in the above-identified patent and that said Letters Patent are hereby corrected as shown below:

| | | |
|---|---|---|
| Column 9, | line 4, | delete "if," and insert --If,-- therefor; |
| Column 9, | line 21, | after "Refresh counter circuitry 73" insert --(not shown)--; |
| Column 10, | line 13, | after "on" delete "the" ; |
| Column 10, | line 21, | at end of line insert --,--; |
| Column 10, | line 22, | delete "," at beginning of line; and |
| Column 12, | line 10, | after "circuitry 73" insert --(not shown)--. |

In the claims:

| | | | |
|---|---|---|---|
| Claim 1, | Column 14, | line 5, | after "cells" insert --,--; |
| Claim 1, | Column 14, | line 7, | delete "a" and insert --the-- therefor; |
| Claim 1, | Column 14, | line 10, | delete "a" and insert --the-- therefor; |
| Claim 1, | Column 14, | line 12, | delete "a" and insert --the-- therefor; and |
| Claim 1, | Column 14, | line 23, | after "the" insert --plurality of --. |

Signed and Sealed this

Twenty-ninth Day of May, 2001

Attest:

NICHOLAS P. GODICI

Attesting Officer      Acting Director of the United States Patent and Trademark Office